United States Patent
Seong et al.

(10) Patent No.: US 10,002,652 B1
(45) Date of Patent: Jun. 19, 2018

(54) MEMORY SYSTEM AND METHOD FOR OPERATING THE SAME

(71) Applicant: SK hynix Inc., Gyeonggi-do (KR)

(72) Inventors: Jin Yong Seong, Seoul (KR); Gun Gi Song, Seoul (KR); Young Sang Ahn, Chungcheongbuk-do (KR); Jae Won Cha, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/638,516

(22) Filed: Jun. 30, 2017

(30) Foreign Application Priority Data

Dec. 20, 2016 (KR) ........................ 10-2016-0174571

(51) Int. Cl.
  *G11C 7/24* (2006.01)
  *G11C 7/10* (2006.01)
  *G06F 11/30* (2006.01)

(52) U.S. Cl.
  CPC ............ *G11C 7/24* (2013.01); *G06F 11/3037* (2013.01); *G11C 7/10* (2013.01)

(58) Field of Classification Search
  CPC .......... G11C 7/24; G11C 7/10; G06F 11/3037
  USPC ................................... 365/195, 185.02, 191
  See application file for complete search history.

(56) References Cited

U.S. PATENT DOCUMENTS

| | | | | |
|---|---|---|---|---|
| 2005/0071592 | A1* | 3/2005 | DeCaro ............... | G06F 12/1425 711/163 |
| 2008/0126675 | A1* | 5/2008 | Fu ........................ | G06F 12/1425 711/103 |
| 2012/0233376 | A1* | 9/2012 | Anbai ..................... | G06F 13/00 710/316 |
| 2016/0117272 | A1* | 4/2016 | Thomson ................ | G06F 13/24 710/266 |

FOREIGN PATENT DOCUMENTS

KR   1020140079914   6/2014

* cited by examiner

*Primary Examiner* — Tan T. Nguyen
(74) *Attorney, Agent, or Firm* — IP & T Group LLP

(57) ABSTRACT

Provided herein may be a memory system and a method of operating the same. A semiconductor memory device may include a write protect pin mode setting unit configured to set, depending on a parameter value stored therein, a write protect pin of the semiconductor memory device as any one of an input pin and an output pin and a control logic configured to output, when the write protect pin serves as the output pin, internal state information of the semiconductor memory device to an external device.

20 Claims, 7 Drawing Sheets

MEMORY SYSTEM AND METHOD FOR OPERATING THE SAME

CROSS-REFERENCE TO RELATED APPLICATION

The present application claims priority under 35 U.S.C. § 119(a) to Korean patent application number 10-2016-0174571 filed on Dec. 20, 2016 in the Korean Intellectual Property Office, the entire disclosure of which is incorporated herein by reference.

BACKGROUND

Field of Invention

Various embodiments of the present disclosure generally relate to an electronic device, and more particularly, to a memory system and a method for operating the same.

DESCRIPTION OF RELATED ART

A memory system has been widely used as data storage for digital devices such as a computer, a digital camera, an MP3 player, and a smartphone. Such a memory system may include a semiconductor memory device, which stores data, and a controller for controlling the semiconductor memory device. The digital devices operate as a host of the memory system, and the controller transmits commands and data between the host and the semiconductor memory device.

Semiconductor memory devices are memory devices embodied using a semiconductor such as silicon (Si), germanium (Ge), gallium arsenide (GaAs), Indium phosphide (InP), or the like. Semiconductor memory devices are classified into volatile memory devices and nonvolatile memory devices.

The volatile memory device is a memory device in which data stored therein is lost when power is turned off. Examples of volatile memory devices include static RAM (SRAM), dynamic RAM (DRAM), synchronous DRAM (SDRAM), etc. The nonvolatile memory device is a memory device in which data stored therein is maintained even when power is turned off. Examples of nonvolatile memory devices include read only memory (ROM), programmable ROM (PROM), electrically programmable ROM (EPROM), electrically erasable programmable ROM (EEPROM), flash memory, phase-change random access memory (PRAM), magnetic RAM (MRAM), resistive RAM (RRAM), ferroelectric RAM (FRAM), etc. The flash memory is classified into a NOR type and a NAND type.

SUMMARY

Various embodiments of the present disclosure are directed to a memory system including a semiconductor memory device using a write protect pin for output.

An embodiment of the present disclosure may provide for a semiconductor memory device including: a write protect pin mode setting unit configured to set, depending on a parameter value stored therein, a write protect pin of the semiconductor memory device as any one of an input pin and an output pin and a control logic configured to output, when the write protect pin serves as the output pin, internal state information of the semiconductor memory device to an external device.

An embodiment of the present disclosure may provide for a controller configured to control a semiconductor memory device, the controller including: an interface unit configured to receive a detection signal for internal state information of the semiconductor memory device through a write protect pin of the semiconductor memory device and a processing unit configured to transmit an operation stop command to the semiconductor memory device according to the detection signal.

An embodiment of the present disclosure may provide for a memory system including: a semiconductor memory device configured to output a detection signal representing an unstable operation condition thereof through a write protect pin and a controller configured to transmit an operation stop command to the semiconductor memory device according to the detection signal.

DETAILED DESCRIPTION

Figure 1:
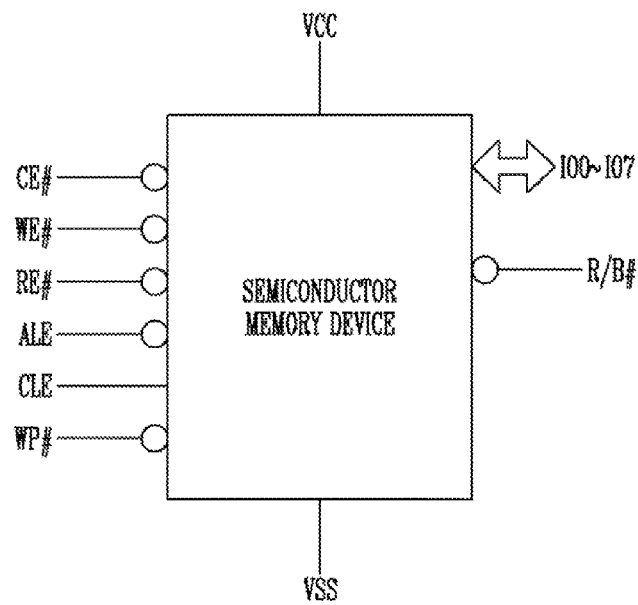
FIG. 1 is a diagram illustrating a pin configuration of a semiconductor memory device.

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but may include deviations In shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but those terms should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "Including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a pin configuration of the semiconductor memory device.

Referring to FIG. 1, the semiconductor memory device may be coupled to an external device through a plurality of pins. For example, the semiconductor memory device may communicate with an external controller through a chip enable pin CE#, a write enable pin WE#, a read enable pin RE#, an address latch enable pin ALE, a command latch enable pin CLE, a write protect pin WP#, a ready/busy pin RB# and data input/output pins IO0 to IO7. In an embodiment, the semiconductor memory device may include a VCC pin that receives an external supply voltage and a VSS pin that receives a ground voltage. In various embodiments, although not shown in the drawings, the semiconductor memory device may further include a VCCQ pin which is configured to receive a supply voltage for an internal input/output buffer, and a VSSQ pin which is configured to receive the ground voltage for the internal input/output buffer.

The chip enable pin CE# may transfer a signal for controlling selection of the semiconductor memory device. The semiconductor memory device may receive, through the chip enable pin CE#, a chip enable signal transmitted by the external controller. The semiconductor memory device may receive a signal that is inputted through the chip enable pin CE#. However, the semiconductor memory device may not output a signal to the external controller through the chip enable pin CE#. In an embodiment, the chip enable pin CE# may be an input pin. The chip enable signal in a low state may indicate that the semiconductor memory device has been selected. The chip enable signal in a high state may indicate that the semiconductor memory device is in a standby state or a ready state. In an embodiment, when the semiconductor memory device is in a busy state, the chip enable signal may be ignored. Therefore, when the semiconductor memory device is in the busy state, although the chip enable signal is in a high state, the semiconductor memory device does not enter the standby state.

The data input/output pins IO0 to IO7 may be used to transfer a command, an address or data from the external controller. Alternatively, the data input/output pins IO0 to IO7 may be used to transfer data from the semiconductor memory device to the external controller. That is, the data input/output pins IO0 to IO7 may serve as an input/output interface. In an embodiment, the data input/output pins IO0 to IO7 may float to a high impedance state when the semiconductor memory device is not selected or output of data is in a deactivated state.

The write enable pin WE# may be used to transfer, from the external controller, a write enable signal that is a clock signal for latching a command, an address or data which are inputted through the data input/output pins IO0 to IO7. The semiconductor memory device may not output a signal to the external controller through the write enable pin WE#. That is, the write enable pin WE# may be an input pin. Information which is inputted through the data input/output pins IO0 to IO7 may be latched at a rising edge of the write enable signal.

The read enable pin RE# may be used for the semiconductor memory device to receive a read enable signal from the external controller. The semiconductor memory device may not output a signal to the external controller through the read enable pin RE#. That is, the read enable pin RE# may be an input pin. The read enable signal may be enabled when data is transmitted from the semiconductor memory device to an input/output bus.

The ready/busy pin RB# may be an output pin which is used for transferring a ready signal or a busy signal from the semiconductor memory device to the external controller. The busy signal having a low level indicates that the semiconductor memory device is performing an operation. The ready signal having a high level indicates that the semiconductor memory device is ready for an operation in response to a command, an address or data from the external controller.

The address latch enable pin ALE may be used for the semiconductor memory device to receive an address latch enable signal from the external controller. The address latch enable signal may indicate that data inputted through the data input/output pins IO0 to IO7 is an address. For example, data inputted through the data input/output pins IO0 to IO7 may be latched by an address register when the address latch enable signal is in an enable state and the write enable signal is a rising edge.

The command latch enable pin CLE may be used for the semiconductor memory device to receive a command latch enable signal from the external controller. The command latch enable signal may indicate that data inputted through the data input/output pins IO0 to IO7 is a command. For example, data inputted through the data input/output pins IO0 to IO7 may be latched by a command register when the command latch enable signal is in an enable state and the write enable signal is a rising edge.

In an embodiment, when both the address latch enable signal and the command latch enable signal are in a deactivated state, the type of signals inputted through the data input/output pins IO0 to IO7 may be data. The semiconductor memory device may not output a signal to the external controller through the address latch enable pin ALE or the command latch enable pin CLE. That is, the address latch enable pin ALE and the command latch enable pin CLE may be input pins.

The write protect pin WP# may be used to transfer, from the external controller, a write protect signal for preventing an undesirable write operation or providing a security function to the semiconductor memory device. While the write protect signal is in a low state, a write operation of the semiconductor memory device may not be performed, and data stored in the semiconductor memory device may not be changed. In an embodiment, a write operation may include a program operation through which data is stored in the semiconductor memory device, and an erase operation through which data is erased from the semiconductor memory device.

A conventional write protect pin WP# has been used as an input pin that transfers only a write protect signal from the external controller. However, a write protect function may not be used depending on the settings of the external controller. In the conventional art, it is only the ready/busy pin RB# through which the semiconductor memory device outputs a signal to the external controller independently from the data input/output pins IO0 to IO7. The ready/busy pin RB# always outputs to the external controller, a signal reporting whether the semiconductor memory device is operating or ready. An additional pin or line for transferring to the external controller a signal for reporting environmental variation in the semiconductor memory device independently from the data input/output pins IO0 to IO7 may be provided.

According to an embodiment of the present disclosure, in the semiconductor memory device, the write protect pin WP# may be used as an input pin for performing a write protect function or as an output pin for outputting a detection signal when an abnormal state is detected in the semiconductor memory device. Furthermore, in an embodiment of the present disclosure, the external controller may control the operation of the semiconductor memory device according to the detection signal transferred from the semiconductor memory device through the write protect pin WP#.

Figure 2:
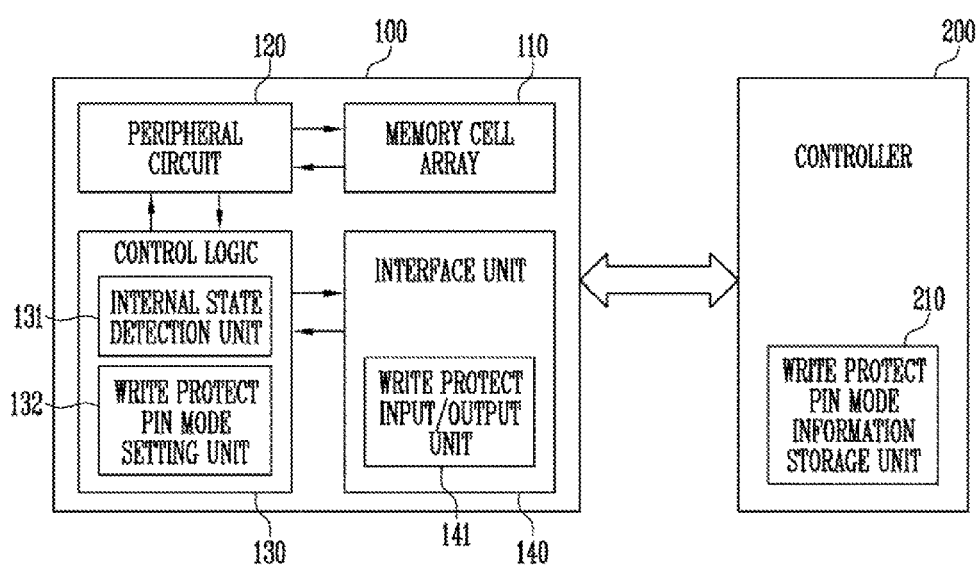
FIG. 2 is a block diagram illustrating a memory system according to an embodiment of the present disclosure.

FIG. 2 is a block diagram illustrating a memory system 50 according to an embodiment of the present disclosure.

Referring to FIG. 2, the memory system 50 may include a semiconductor memory device 100, and a controller 200 for controlling the semiconductor memory device 100.

The semiconductor memory device 100 may take many alternative forms, such as a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In addition, the semiconductor memory device 100 according to the present disclosure may be implemented as a three-dimensional array structure. The present disclosure may also be applied not only to a flash memory device in which a charge storage layer is formed of a conductive floating gate (FG), but also to a charge trap flash (CTF) memory device in which a charge storage layer is formed of an insulating layer.

The semiconductor memory device 100 is operated under the control of the controller 200. In an embodiment, the semiconductor memory device 100 may be a flash memory device.

The semiconductor memory device 100 may include a memory cell array 110, a peripheral circuit 120, a control logic 130 and an interface unit 140.

The semiconductor memory device 100 is configured to receive a command and an address from the controller 200 and to access a region selected by the address from the memory cell array 110. That is, the semiconductor memory device 100 may perform an internal operation corresponding to the command on the region selected by the address.

For example, the semiconductor memory device 100 may perform a program operation, a read operation and an erase operation. During a program operation, the semiconductor memory device 100 may program data in a region selected by an address. During a read operation, the semiconductor memory device 100 may read data from a region selected by an address. During an erase operation, the semiconductor memory device 100 may erase data stored in a region selected by an address.

The memory cell array 110 may include a plurality of memory cells. In an embodiment, the memory cells may be nonvolatile memory cells. In an embodiment, each of the memory cells may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may drive the memory cell array 110. For example, the peripheral circuit 120 may drive the memory cell array 110 so that a program operation, a read operation, and an erase operation are performed.

Under the control of the control logic 130, the peripheral circuit 120 may perform a program operation for storing data in the memory cell array 110, an erase operation for erasing the stored data, or a read operation for reading the stored data.

The control logic 130 may control the peripheral circuit 120 to perform an operation corresponding to a command provided from the controller 200.

The semiconductor memory device 100 according to an embodiment of the present disclosure may use the write protect pin WP# as either an input pin transferring a signal to the semiconductor memory device 100 or an output pin transferring a signal to the controller 200.

In an embodiment, the control logic 130 may include an internal state detection unit 131 and a write protect pin mode setting unit 132.

The internal state detection unit 131 may detect an internal state of the semiconductor memory device 100. For example, the internal state may refer to environmental variation such as a temperature, humidity, a voltage, as a current value of the semiconductor memory device 100 which affect the operation of the semiconductor memory device 100.

In an embodiment, the internal state detection unit 131 may include a voltage detection unit which detects whether an internal or external voltage decreases below a reference voltage level, and a temperature detection unit which detects whether an internal or external temperature is out of a range defined by reference threshold temperatures.

The Internal state detection unit 131 may transmit a detection signal to the interface unit 140 when the detection units detect the above-described situation, that is, when it is difficult for the semiconductor memory device 100 to perform a normal operation depending on the internal state of the semiconductor memory device 100.

The write protect pin mode setting unit 132 may set an operation mode of the write protect pin WP# of the semiconductor memory device 100. The write protect pin mode setting unit 132 may output a write protect control signal to the interface unit 140 based on a parameter value of a register included therein. The write protect pin mode setting unit 132 may store a parameter value corresponding to any one of an input mode and an output mode, and output the write protect control signal to the interface unit 140 based on the parameter value.

In an embodiment, the control logic 130 may control the write protect pin mode setting unit 132 to change the parameter value according to a command inputted from the controller 200. For example, according to a set parameter command inputted from the controller 200, the write protect pin mode setting unit 132 receives an address of an internal register and a parameter value corresponding to any one of the input mode and the output mode and may change the parameter value stored therein based on the provided address and parameter value.

The interface unit 140 provides an interface for coupling with the controller 200. The interface unit 140 may include internal input/output buffers coupled with the pins of the semiconductor memory device described with reference to FIG. 1.

In an embodiment, the interface unit 140 may include a write protect (WP) input/output unit 141.

The write protect (WP) input/output unit 141 may control the write protect pin WP# such that the write protect pin WP# operates as any one of the input pin and the output pin depending on a write protect control signal outputted from the write protect pin mode setting unit 132.

When the write protect pin WP# is used as the input pin, if a write protect signal is inputted through the write protect pin WP# from the controller 200, the semiconductor memory device 100 may not perform a write operation. Therefore, data stored in the semiconductor memory device 100 may not be changed while the write protect signal is inputted.

When the write protect pin WP# is used as the output pin, the semiconductor memory device 100 may output a write protect output signal through the write protect pin WP# in response to a detection signal outputted from the internal state detection unit 131.

The controller 200 controls the semiconductor memory device 100. The controller 200 may command the semiconductor memory device 100 in response to a request from a host (not shown).

In an embodiment, the controller 200 may control the semiconductor memory device 100 so that a program operation, a read operation or an erase operation is performed. During a program operation, the controller 200 may provide a program command, an address, and data to the semiconductor memory device 100. During a read operation, the controller 200 may provide a read command and an address to the semiconductor memory device 100. During an erase operation, the controller 200 may provide an erase command and an address to the semiconductor memory device 100.

According to an embodiment of the present disclosure, the controller 200 may set the write protect pin WP# of the semiconductor memory device 100 such that the write protect pin WP# is used as the input pin or the output pin.

For example, when the write protect pin of the semiconductor memory device 100 is used as the input pin, the controller 200 may provide a parameter value corresponding to the input pin to the semiconductor memory device. When the write protect pin of the semiconductor memory device 100 is used as the output pin, the controller 200 may provide a parameter value corresponding to the output pin to the semiconductor memory device 100. In an embodiment, a parameter value corresponding to the input pin or the output pin may be transmitted to the semiconductor memory device 100 using a set parameter command.

In various embodiments, the controller 200 may include a write protect pin mode information storage unit 210. The write protect pin mode information storage unit 210 may store write protect pin mode information about whether the write protect pin of the semiconductor memory device 100 is set as the input mode or the output mode. For example, the write protect pin mode information storage unit 210 may store, as the write protect pin mode information, a parameter value corresponding to the input mode or the output mode that is provided to the semiconductor memory device 100 through a set parameter command by the controller 200.

In an embodiment, the controller 200 may control a plurality of semiconductor memory devices. In this case, the write protect pin mode information storage unit 210 may store the write protect pin mode information about the input/output modes of the write protect pins of the semiconductor memory devices.

In an embodiment, when the write protect pin mode information is damaged or updated, the controller 200 may obtain a parameter value corresponding to the input mode or the output mode from each semiconductor memory device 100 through a get parameter command.

When a write protect output signal outputted from a semiconductor memory device 100 which uses the write protect pin WP# as the output pin is inputted to the controller 200, the controller 200 may transmit, to the corresponding semiconductor memory device 100, a suspend command for suspending the operation of the semiconductor memory device 100. In addition, the controller 200 may transmit a status read command for checking the state of the semiconductor memory device 100 to the semiconductor memory device 100.

In an embodiment, the controller 200 may receive a write protect output signal while the semiconductor memory device 100 performs a program operation. For example, after the controller 200 has transmitted a program command to the semiconductor memory device 100, the controller 200 may receive a write protect output signal outputted from the write protect pin WP# of the semiconductor memory device 100 before checking whether an operation corresponding to the program command has been completed. In this case, a result of performing the operation corresponding to the program command transmitted to the semiconductor memory device 100 is unreliable. Therefore, there is no need for the controller 200 to transmit a status read command to the semiconductor memory device 100 to check whether the operation corresponding to the program command has been completed.

After the controller 200 has transmitted a program command to the semiconductor memory device 100, if the controller 200 receives a write protect output signal outputted from the write protect pin WP# of the semiconductor memory device 100 before checking whether an operation corresponding to the program command has been completed, the controller 200 may control the semiconductor memory device 100 such that previously transmitted data is programmed in another memory region. The "another memory region" may be different from a memory block in which the previously transmitted data is currently stored. In detail, the controller 200 may generate a command for programming the previously transmitted data in the another memory region, change an address for the another memory region in which the previously transmitted data is to be stored again, and then retransmit the previously transmitted data to the semiconductor memory device 100.

Figure 3:
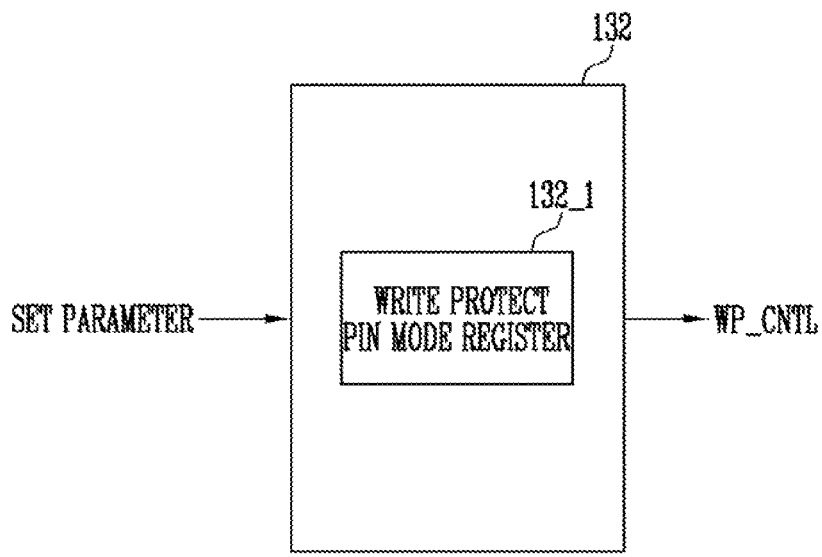
FIG. 3 is a block diagram illustrating the operation of a write protect pin mode setting unit of FIG. 2.

FIG. 3 is a block diagram illustrating the operation of the write protect pin mode setting unit 132 of FIG. 2.

Referring to FIG. 3, the write protect pin mode setting unit 132 of the semiconductor memory device may include a write protect pin mode register 132_1 therein. The write protect pin mode setting unit 132 may output, based on a parameter value stored in the write protect pin mode register 132_1, a write protect control signal WP_CNTL to the interface unit 140 described with reference to FIG. 2.

The parameter value stored in the write protect pin mode register 132_1 may determine the operation mode of the write protect pin WP# of the semiconductor memory device. For example, the write protect pin mode register 132_1 may store a parameter value corresponding to any one of the input mode and the output mode of the write protect pin WP#.

In an embodiment, the parameter value stored in the write protect pin mode register 132_1 may be changed depending on a set parameter command SET PARAMETER inputted from the controller 200. In detail, if a set parameter command, and an address and a parameter value of the write protect pin mode register 132_1 are provided from the controller 200, the semiconductor memory device 100 may change the parameter value of the write protect pin mode register 132_1 into the inputted parameter value.

Figure 4:
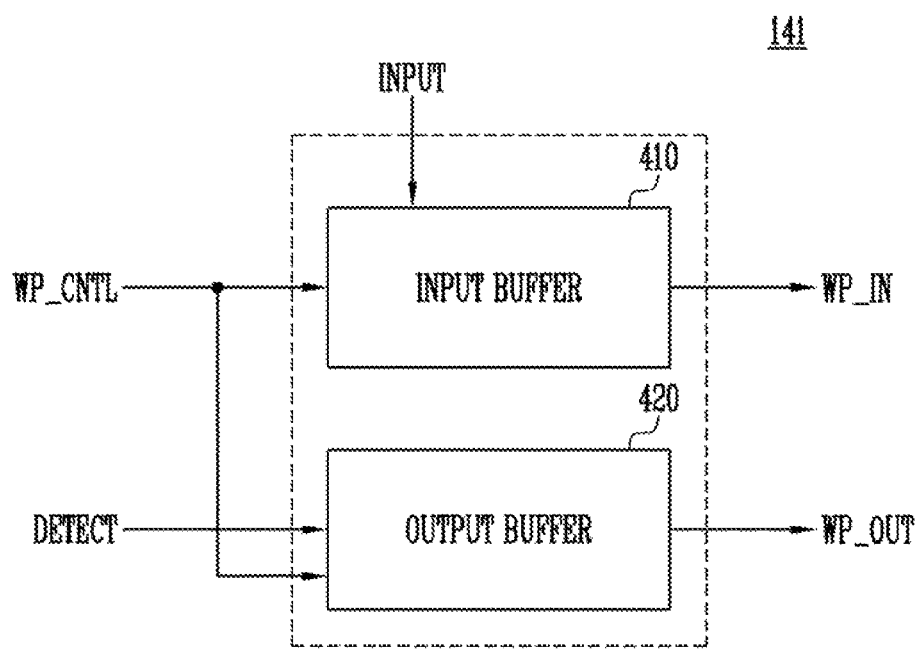
FIG. 4 is a block diagram illustrating the operation of a write protect input/output unit of FIG. 2.

FIG. 4 is a block diagram illustrating the operation of the write protect input/output unit 141 of FIG. 2.

Referring to FIG. 4, the write protect input/output unit 141 may receive a write protect control signal WP_CNTL outputted from the write protect pin mode setting unit 132 described with reference to FIG. 3.

The write protect input/output unit 141 may include an input buffer 410 and an output buffer 420.

Any one of the input buffer 410 and the output buffer 420 may operate depending on the write protect control signal WP_CNTL. For example, if the write protect control signal WP_CNTL is high, the input buffer 410 may operate. If the write protect control signal WP_CNTL is low, the output buffer 420 may operate. Alternatively, the input buffer 410 may operate when the write protect control signal WP_CNTL is low, and the output buffer 420 may operate when the write protect control signal WP_CNTL is high.

The input buffer 410 may be used when the write protect pin WP# is used as the input pin. The input buffer 410 may receive a write protect control signal WP_CNTL and an input signal INPUT, which is inputted from the controller 200 through the write protect pin WP#, and transmit a write protect input signal WP_IN to the control logic 130 of the semiconductor memory device 100.

The output buffer 420 may be used when the write protect pin WP# is used as the output pin. The output buffer 420 may receive a write protect control signal WP_CNTL and a detection signal DETECT, which is an output signal of the internal state detection unit 131 of the control logic 130, and output a write protect output signal WP_OUT to the controller 200 through the write protect pin WP#.

Figure 5:
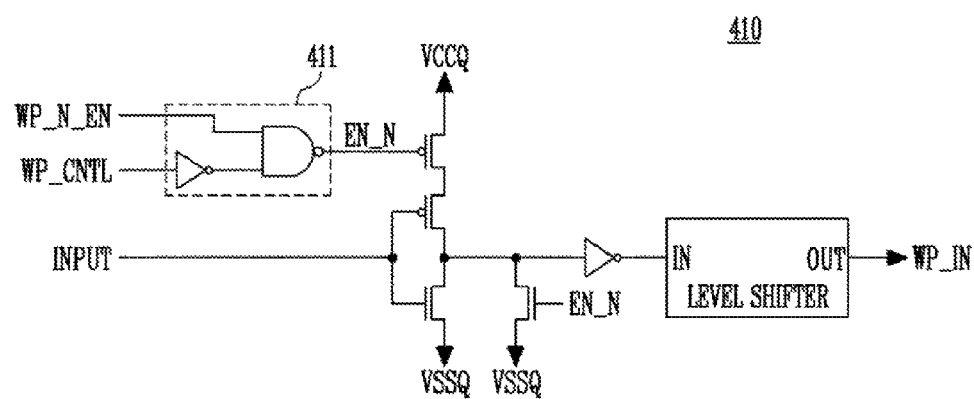
FIG. 5 is a diagram illustrating the operation of an input buffer of FIG. 4.

FIG. 5 is a diagram illustrating the operation of the input buffer 410.

Referring to FIG. 5, the input buffer 410 may include an enable signal generating unit 411. The enable signal generating unit 411 may receive a write protect control signal WP_CNTL and a write protect signal WP_N_EN, and output an enable signal EN_N. The enable signal EN_N may be an internal signal which is generated when a signal of the write protect pin WP# changes from a high level to a low level. The enable signal generating unit 411 may output the enable signal EN_N based on the write protect control signal WP_CNTL and the write protect signal WP_N_EN that are inputted.

The enable signal EN_N may drive the input buffer 410. The input buffer 410 may output an input signal INPUT, which is inputted through the write protect pin WP#, as a write protect input signal WP_IN via a level shifter LEVEL SHIFTER. The outputted write protect input signal WP_IN may prevent a write operation to the semiconductor memory device.

The circuit of the input buffer 410 is not limited to the embodiment shown in FIG. 5, and may be changed in various ways.

Figure 6:
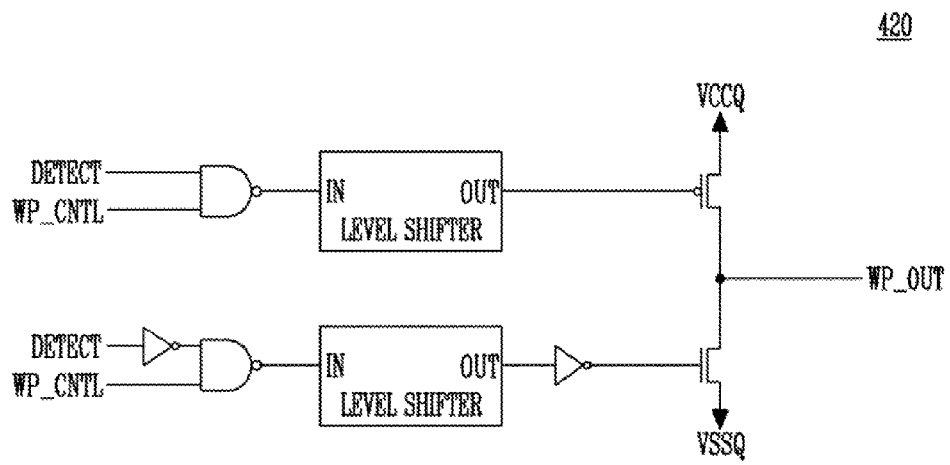
FIG. 6 is a diagram illustrating the operation of an output buffer of FIG. 4.

FIG. 6 is a diagram illustrating an operation of the output buffer 420 of FIG. 4.

Referring to FIG. 6, the output buffer 420 may receive a detection signal DETECT outputted from the internal state detection unit 131 described with reference to FIG. 2.

In detail, the output buffer 420 may output a write protect output signal WP_OUT based on a write protect control signal WP_CNTL and a detection signal DETECT which are inputted thereto.

The circuit of the output buffer 420 is not limited to the embodiment shown in FIG. 6, and it may have various forms.

The write protect output signal WP_OUT may be provided to the controller 200 described with reference to FIG. 2 through the write protect pin WP#.

Figure 7:
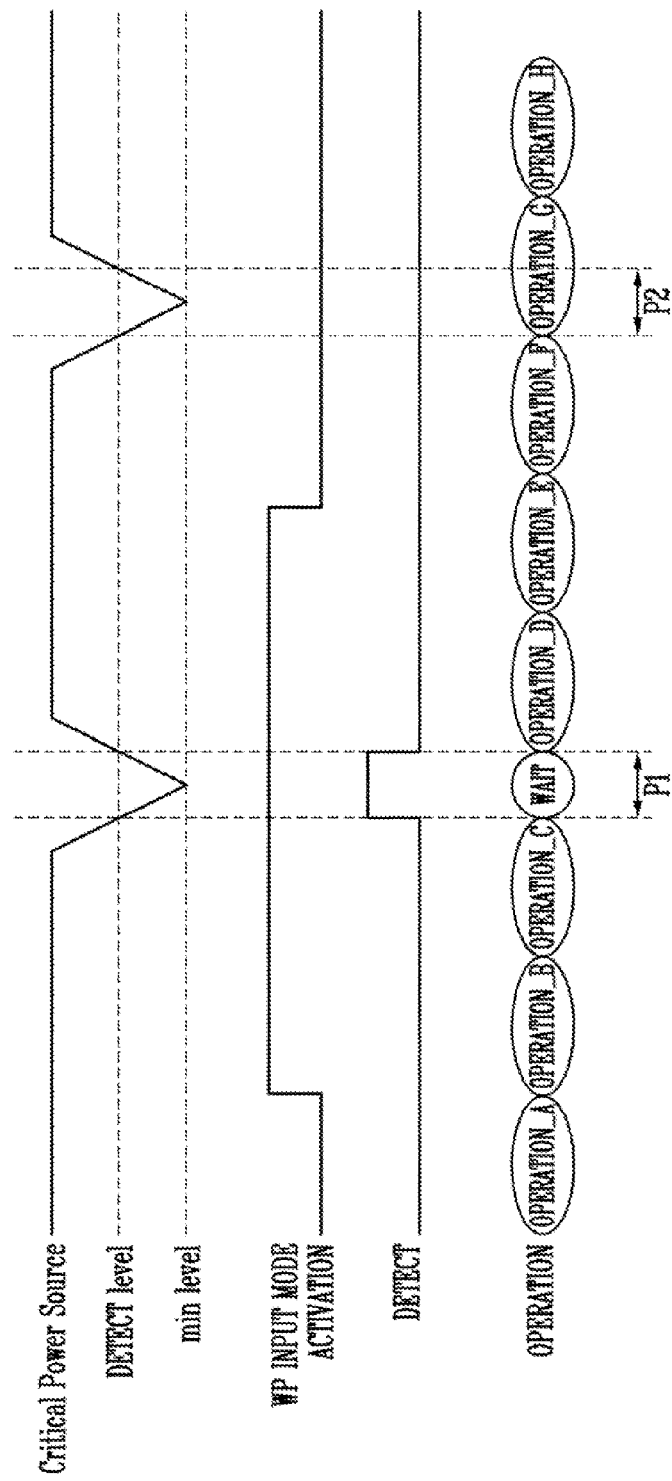
FIG. 7 is a waveform diagram illustrating the operation of a memory system in accordance with an embodiment of the present disclosure.

FIG. 7 is a waveform diagram illustrating the operation of a memory system in accordance with an embodiment of the present disclosure.

Referring to FIG. 7, the semiconductor memory device according to an embodiment of the present disclosure may use the write protect pin WP# not only as the input pin but also as the output pin.

When the write protect pin WP# is used as the output pin, the semiconductor memory device 100 may provide the controller 200 through the write protect pin WP# with a detection signal reporting that it is difficult for the semiconductor memory device to perform a normal operation depending on an internal state.

In FIG. 7, the level of an external or internal power signal Critical Power Source which is inputted to the semiconductor memory device 100 falls and rises twice during a process in which the semiconductor memory device 100 performs operation A to operation H.

In a first period P1 and a second period P2, the level of the external or internal power signal Critical Power Source that is inputted to the semiconductor memory device 100 falls below a detection level DETECT level and then returns to its original state. According to an embodiment of the present disclosure, when the write protect pin WP# of the semiconductor memory device is used as the output pin, a write protect (WP) input mode activation signal is activated and is in a high state. When the write protect pin WP# of the semiconductor memory device 100 is used as the input pin, the WP input mode activation signal may be in a low state. Therefore, in the first period P1, a detection signal DETECT may be outputted while the level of the external or internal power signal Critical Power Source is below the detection level. A result of an operation performed while the detection signal is outputted may be unreliable. Therefore, if the detection signal is outputted through the write protect pin WP#, the controller 200 may interrupt a corresponding operation, or perform a following operation of waiting for transmission of data to the semiconductor memory device 100. For example, if the detection signal is outputted after operation C has been performed, operation D is waited for rather than being performed. When the detection signal is no longer outputted, operation D is performed.

In the second period P2, the WP input mode activation signal is deactivated and is in a low state. Therefore, unless a write protect signal is inputted to the write protect pin WP#, the semiconductor memory device may continuously perform operations. Although the level of the external or internal power signal Critical Power Source is lower than the detection level, the semiconductor memory device continuously performs ongoing operation G without stopping it. Consequently, since operation G is performed under conditions in which it is difficult for the semiconductor memory device to perform a normal operation, the reliability of the result of the operation G may be reduced.

According to an embodiment of the present disclosure, since the write protect pin WP#, which has been used only as the input pin in the conventional art, may be used as the output pin, information about the internal state of the semiconductor memory device may be outputted to the external controller without using a separate command. Therefore, overhead of the overall operation of the external controller may be reduced.

Furthermore, when a detection signal which indicates an abnormal state is transmitted to the external controller, the external controller may change a corresponding operation to make a result of the operation reliable, or interrupt the operation. Thus, the semiconductor memory device may be prevented from malfunctioning.

Figure 8:
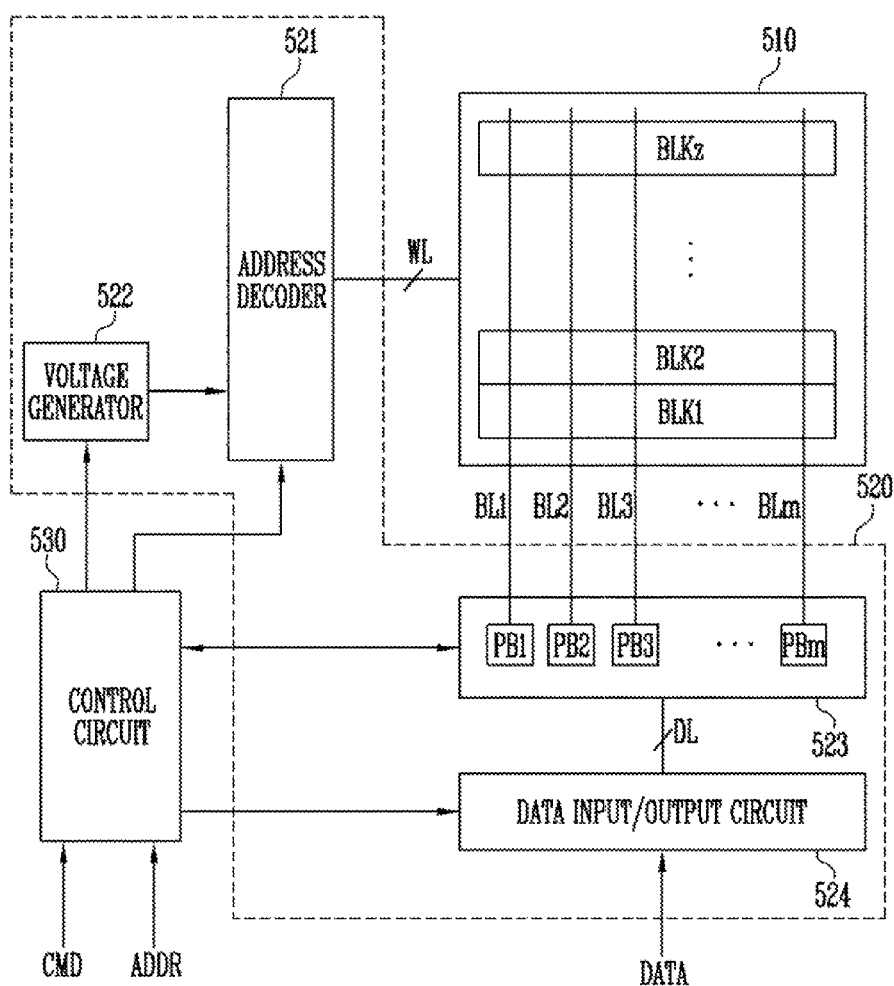
FIG. 8 is a block diagram illustrating an example of the semiconductor memory device of FIG. 2.

FIG. 8 is a block diagram illustrating an embodiment of the semiconductor memory device 100 of FIG. 2.

Referring to FIG. 8, the semiconductor memory device 500 may include a memory cell array 510, a peripheral circuit 520 and a control circuit 530.

The peripheral circuit 520 may include an address decoder 521, a voltage generator 522, a read/write circuit 523, and a data input/output circuit 524.

The memory cell array 510 includes a plurality of memory blocks BLK1 to BLKz. The memory blocks BLK1 to BLKz are coupled to the address decoder 200 through word lines WL. The memory blocks BLK1 to BLKz are coupled to the read/write circuit 523 through bit lines BL1 to BLm. Each of the memory blocks BLK1 to BLKz includes a plurality of memory cells. In an embodiment, the plurality of memory cells may be nonvolatile memory cells. Memory cells coupled to the same word line among the plurality of memory cells are defined as one page. That is, the memory cell array 510 is formed of a plurality of pages.

The peripheral circuit 520 drives the memory cell array 510 under the control of the control circuit 530. For example, the peripheral circuit 520 may drive the memory cell array 510 so that a program operation, a read operation, and an erase operation are performed under the control of the control circuit 530.

The address decoder 521 is coupled to the memory cell array 510 through the word lines WL. The address decoder 521 may be operated in response to the control of the control circuit 530. The address decoder 521 may receive addresses ADDR from the control circuit 530 through an input/output buffer (not shown) included in the semiconductor memory device 500.

The address decoder 521 may decode a block address among the received addresses ADDR. The address decoder 521 may select a corresponding one of the memory blocks BLK1 to BLKz in response to the decoded block address. The address decoder 521 may decode a row address among the received addresses ADDR. The address decoder 521 may select at least one word line of the selected memory block by applying voltages supplied from the voltage generator 522 to at least one word line WL in response to the decoded row address.

During a program operation, the address decoder 521 may apply a program voltage to a selected word line and apply a pass voltage having a level lower than that of the program voltage to unselected word lines. During a program verify operation, the address decoder 521 may apply a verify voltage to a selected word line and apply a verify pass voltage higher than the verify voltage to unselected word lines.

During a read operation, the address decoder 521 may apply a read voltage to a selected word line and apply a pass voltage higher than the read voltage to unselected word lines.

In an embodiment, an erase operation of the semiconductor memory device 500 may be performed on a memory block basis. An address ADDR inputted to the semiconductor memory device 500 during an erase operation includes a block address. The address decoder 521 may decode the block address and select a corresponding one memory block based on the decoded block address. During an erase operation, the address decoder 521 may apply a ground voltage to a word line coupled to the selected memory block. In an embodiment, the address decoder 521 may include a block decoder, a word line decoder, an address buffer, etc.

The voltage generator 522 may generate a plurality of voltages from an external power supply voltage that is applied to the semiconductor memory device 500. The voltage generator 522 is operated under the control of the control circuit 530.

In an embodiment, the voltage generator 522 may generate an internal supply voltage by regulating an external supply voltage. The internal supply voltage generated by the voltage generator 522 may be used as an operating voltage for the semiconductor memory device 500.

In an embodiment, the voltage generator 522 may produce a plurality of voltages using the external supply voltage or the internal supply voltage. For example, the voltage generator 522 may include a plurality of pumping capacitors that receive the internal supply voltage and generate a plurality of voltages by selectively activating the plurality of pumping capacitors under the control of the control logic 530. The generated voltages are applied to selected word lines by the address decoder 521.

The read/write circuit 523 includes first to m-th page buffers PB1 to PBm. The first to m-th page buffers PB1 to PBm are coupled to the memory cell array 100 through the first to m-th bit lines BL1 to BLm, respectively. The first to m-th page buffers PB1 to PBm are operated under the control of the control circuit 530.

The first to m-th page buffers PB1 to PBm perform data communication with the data input/output circuit 524. During a program operation, the first to m-th page buffers PB1 to PBm receive data DATA to be stored through the data input/output circuit 524 and data lines DL.

During a program operation, the first to m-th page buffers PB1 to PBm may transmit the data DATA, received through the data input/output circuit 524, to selected memory cells through the bit lines BL1 to BLm when a program pulse is applied to each selected word line. The memory cells in the selected page are programmed based on the transmitted data DATA. A memory cell coupled to a bit line to which a program enable voltage for example, a ground voltage is applied may have an increased threshold voltage. A threshold voltage of a memory cell coupled to a bit line to which a program inhibit voltage for example, a supply voltage is applied may be maintained. During a program verify operation, the first to m-th page buffers PB1 to PBm may read page data from selected memory cells through the bit lines BL1 to BLm.

During a read operation, the read/write circuit 523 may read data DATA from the memory cells in the selected page through the bit lines BL, and output the read data DATA to the data input/output circuit 524.

During an erase operation, the read/write circuit 523 may float the bit lines BL. In an embodiment, the read/write circuit 523 may include a column select circuit.

The data input/output circuit 524 is coupled to the first to m-th page buffers PB1 to PBm through the data lines DL. The data input/output circuit 524 may be operated under the control of the control circuit 530. During a program operation, the data input/output circuit 524 may receive data DATA to be stored from the external controller (not shown). During a read operation, the data input/output circuit 524 may output the data, received from the first to m-th page buffers PB1 to PBm included in the read/write circuit 523, to the external controller.

The control circuit 530 is coupled to the address decoder 521, the voltage generator 522, the read/write circuit 523, and the data input/output circuit 524. The control circuit 530 may control the overall operation of the semiconductor memory device 500. The control circuit 530 may receive a command CMD and addresses ADDR from the external controller. The control circuit 530 may control the peripheral circuit 520 in response to the command CMD. The control circuit 530 may control the address decoder 521, the voltage generator 522, the read/write circuit 523 and the data input/output circuit 524 so that an operation corresponding to the received command is performed. In an embodiment, during an erase operation, the control circuit 530 may apply an erase voltage (Verase) having a high voltage level to the source line.

Figure 9:
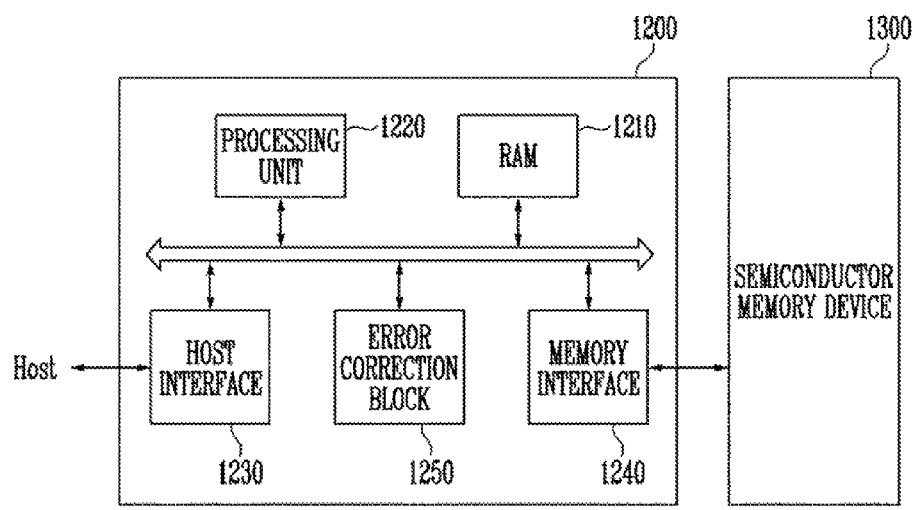
FIG. 9 is a block diagram illustrating a memory system including the semiconductor memory device of FIG. 2.

FIG. 9 is a block diagram illustrating a memory system 1000 including the semiconductor memory device of FIG. 2.

Referring to FIG. 9, the memory system 1000 includes a semiconductor memory device 1300 and a controller 1200.

The semiconductor memory device 1300 may have the same configuration and operation as those of the semiconductor memory device 100 described with reference to FIG. 2. Hereinafter, repetitive descriptions will be omitted.

The controller 1200 may be coupled to a host Host and the semiconductor memory device 1300. The controller 1200 is configured to access the semiconductor memory device 1300 in response to a request from the host Host. For example, the controller 1200 may control read, program, erase, and background operations of the semiconductor memory device 1300. The controller 1200 may provide an interface between the host Host and the semiconductor memory device 1300. The controller 1200 is configured to drive firmware for controlling the semiconductor memory device 1300.

The controller 1200 includes a random access memory (RAM) 1210, a processing unit 1220, a host interface 1230, a memory interface 1240, and an error correction block 1250.

The RAM 1210 is used as at least one of an operation memory of the processing unit 1220, a cache memory between the semiconductor memory device 1300 and the host Host, and a buffer memory between the semiconductor memory device 1300 and the host Host. In an embodiment, the RAM 1210 may operate as the write protect pin mode information storage unit 210 described with reference to FIG. 2.

The processing unit 1220 may control the overall operation of the controller 1200. The processing unit 1220 may control read, program, erase, and background operations of the semiconductor memory device 1000. The processing unit 1220 may drive firmware for controlling the semiconductor memory device 1000. The processing unit 1220 may perform a function of a flash translation layer (FTL). The processing unit 1220 may translate a logical block address (LBA), provided by the host, into a physical block address (PBA) through the FTL. The FTL may receive the LBA using a mapping table and translate the LBA into the PBA. Address mapping methods performed through the FTL include various methods according to a mapping unit. Representative address mapping methods include a page mapping method, a block mapping method, and a hybrid mapping method.

The processing unit 1220 is configured to randomize data received from the host Host. For example, the processing unit 1220 may use a randomizing seed to randomize data received from the host Host. The randomized data is provided, as data to be stored, to the semiconductor memory device 1300 and is then programmed in the memory cell array.

The processing unit 1220 is configured to derandomize data received from the semiconductor memory device 1300 during a read operation. For example, the processing unit 1220 may use a derandomizing seed to derandomize data received from the semiconductor memory device 1300. Derandomized data may be output to the host Host.

In an embodiment, the processing unit 1220 may drive software or firmware to perform the randomizing or derandomizing operation.

The host interface 1230 may include a protocol for performing data exchange between the host Host and the controller 1100. In an example of an embodiment, the controller 1200 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1240 interfaces with the semiconductor memory device 1300. For example, the memory interface 1240 includes a NAND interface or a NOR interface.

The error correction block 1250 uses an error correcting code (ECC) to detect and correct an error in data received from the semiconductor memory device 1300. The error correction block 1250 may correct errors from read page data using an ECC. The error correction code circuit 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the error correction block 1250 may correct errors from read page data. When a number of error bits exceeding the number of correctable bits are included in the read page data, decoding may fail. When a number of error bits less than or equal to the number of correctable bits are included in the page data, decoding may succeed. A success in decoding indicates that the corresponding read command has passed. A failure in decoding indicates that the corresponding read command has failed. When decoding succeeds, the controller 1200 outputs error-corrected page data to the host Host.

The controller 1200 and the semiconductor memory device 1300 may be integrated into a single semiconductor device. In an example of an embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1200 and the semiconductor memory device 1300 may be integrated into a single semiconductor device to form a solid state drive (SSD). The SSD includes a storage device formed to store data in a semiconductor memory. When the memory system is used as the SSD, an operation speed of the host Host coupled to the memory system may be phenomenally improved.

In an embodiment, the memory system may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 1300 or the memory system may be embedded in various types of packages. For example, the semiconductor memory device 1300 or the memory system may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 10:
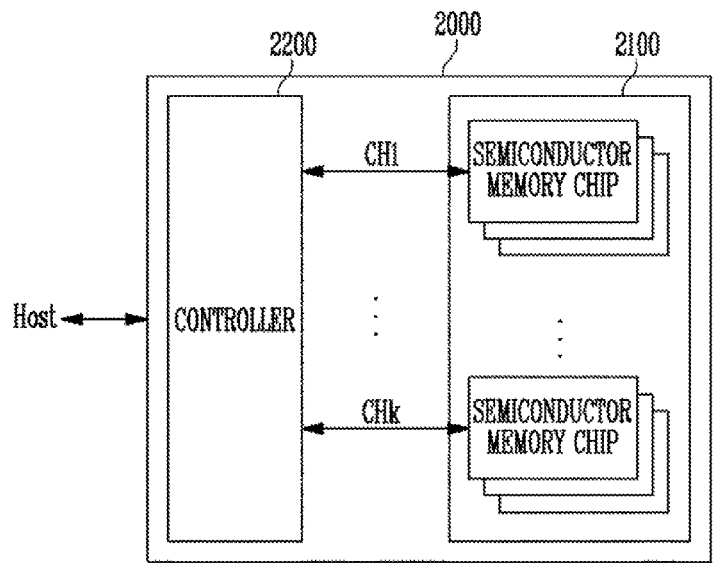
FIG. 10 is a block diagram illustrating an example of application of the memory system of FIG. 9.

FIG. 10 is a block diagram illustrating an example (2000) of application of the memory system of FIG. 9.

Referring to FIG. 10, the memory system 2000 includes a semiconductor memory device 2100 and a controller 2200. The semiconductor memory device 2100 includes a plurality of memory chips. The semiconductor memory chips are divided into a plurality of groups.

Referring to FIG. 10, it is illustrated that each of the plurality of groups communicates with the controller 2200 through first to k-th channels CH1 to CHk. Each semiconductor memory chip may have the same configuration and operation as those of an embodiment of the semiconductor memory device 1300 described with reference to FIG. 9.

Each group communicates with the controller 2200 through one common channel. The controller 2200 has the same configuration as that of the controller 1200 described with reference to FIG. 9 and is configured to control a plurality of memory chips of the semiconductor memory device 2100 through the plurality of channels CH1 to CHk.

In FIG. 10, a plurality of semiconductor memory chips are illustrated as being connected to each channel. However, it will be understood that the memory system 2000 may be modified such that a single memory chip is connected to each channel.

Figure 11:
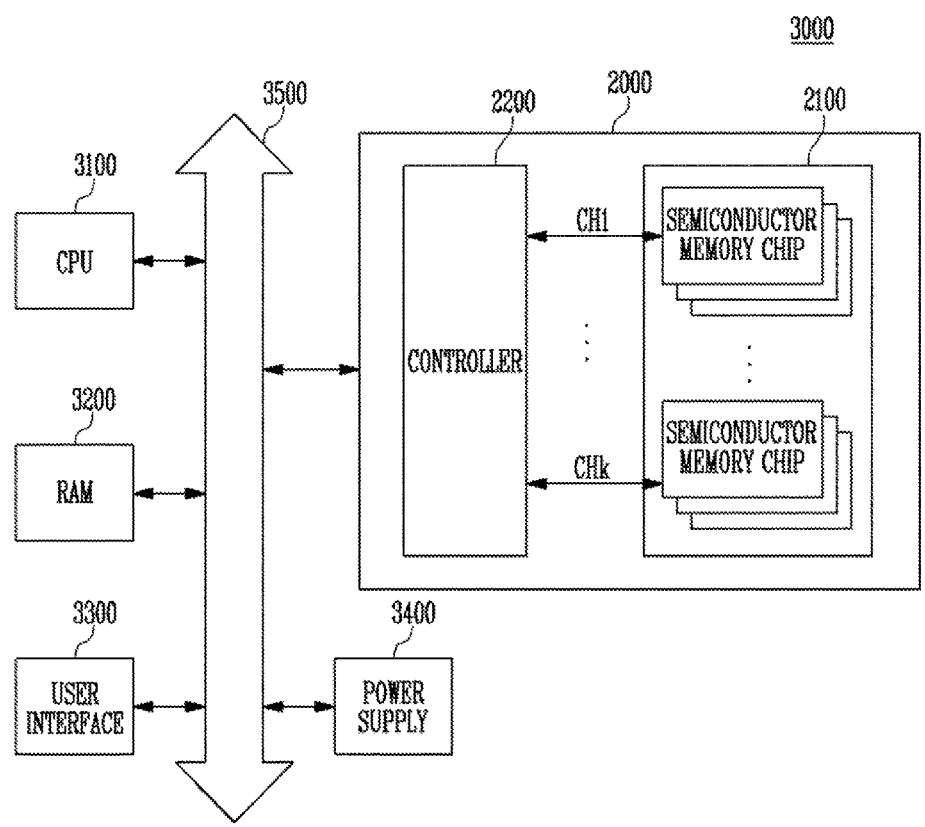
FIG. 11 is a block diagram illustrating a computing system including the memory system illustrated with reference to FIG. 10.

FIG. 11 is a block diagram illustrating a computing system including the memory system illustrated with reference to FIG. 10.

Referring to FIG. 11, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

Referring to FIG. 11, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

Referring to FIG. 11, the memory system 2000 described with reference to FIG. 10 may be provided. However, the memory system 2000 may be replaced with the memory system 1000 described with reference to FIG. 9. In an embodiment, the computing system 3000 may include all of the memory systems 1000 and 2000 described with reference to FIGS. 9 and 10.

Various embodiments of the present disclosure provide a memory system including a semiconductor memory device using a write protect pin for output, and a method for operating the same.

Although the embodiments of the present disclosure have been disclosed, those skilled in the art will appreciate that various modifications, additions and substitutions are possible, without departing from the scope and spirit of the invention.

Therefore, the scope of the present disclosure must be defined by the appended claims and equivalents of the claims rather than by the description preceding them.

In the above-discussed embodiments, all steps may be selectively performed or skipped. In addition, the steps in each embodiment may be not always performed in regular order. Furthermore, the embodiments disclosed in the present specification and the drawings aim to help those with ordinary knowledge in this art more clearly understand the present disclosure rather than aiming to limit the bounds of the present disclosure. That is, one of ordinary skill in the art to which the present disclosure belongs will be able to easily understand that various modifications are possible based on the technical scope of the present disclosure.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
    a write protect pin mode setting unit which sets, depending on a parameter value stored therein, a write protect pin of the semiconductor memory device which functions as both an input pin and an output pin; and
    a control logic which outputs, when the write protect pin serves as the output pin, internal state information of the semiconductor memory device to an external device.

2. The semiconductor memory device according to claim 1, wherein the control logic comprises an internal state detection unit which provides the external device with a detection signal representing an unstable operation condition of the semiconductor memory device through the write protect pin.

3. The semiconductor memory device according to claim 2, wherein the internal state detection unit generates the detection signal when an external or internal voltage of the semiconductor memory device is a threshold voltage or less.

4. The semiconductor memory device according to claim 2, wherein the internal state detection unit generates the detection signal when an internal temperature of the semiconductor memory device is a preset low temperature or less, or is a preset high temperature or greater.

5. The semiconductor memory device according to claim 2, further comprising an output buffer which provides the detection signal to the external device through the write protect pin.

6. The semiconductor memory device according to claim 1, wherein the write protect pin mode setting unit comprises a write protect pin mode register which stores the parameter value.

7. The semiconductor memory device according to claim 1, wherein the control logic changes the parameter value in response to a set parameter command inputted from the external device.

8. The semiconductor memory device according to claim 1, wherein, when the write protect pin serves as the input pin, the control logic receives, through the write protect pin, a write protect signal that inhibits a write operation to the semiconductor memory device.

9. The semiconductor memory device according to claim 8, wherein the write operation is either a program operation or an erase operation.

10. The semiconductor memory device according to claim 8, further comprising an input buffer which receives the write protect signal through the write protect pin and transmits the write protect signal to the control logic.

11. A controller which controls a semiconductor memory device, the controller comprising:
    an interface unit which receives a detection signal for internal state information of the semiconductor memory device through a write protect pin of the semiconductor memory device which functions as both an input pin and an output pin; and
    a processing unit which transmits an operation stop command to the semiconductor memory device according to the detection signal.

12. The controller according to claim 11, further comprising a write protect pin mode information storage unit which stores information about an operation mode of the write protect pin.

13. The controller according to claim 12, wherein the information about the operation mode of the write protect pin includes a parameter value corresponding to the operation mode of the write protect pin.

14. The controller according to claim 13, wherein the processing unit transmits the parameter value to the semiconductor memory device using a set parameter command.

15. A memory system comprising:
    a semiconductor memory device which outputs a detection signal representing an unstable operation condition thereof through a write protect pin which functions both as an input pin and an output pin; and
    a controller which transmits an operation stop command to the semiconductor memory device according to the detection signal.

16. The memory system according to claim 15, wherein the detection signal is outputted when an external or internal voltage of the semiconductor memory device is a threshold voltage or less.

17. The memory system according to claim 15, wherein the detection signal is outputted when an internal temperature of the semiconductor memory device is a preset low-temperature or less, or is a preset high-temperature or greater.

18. The memory system according to claim 15, wherein the controller sets the write protect pin as any one of an input pin and an output pin using a set parameter command.

19. The memory system according to claim 15, wherein the semiconductor memory device comprises a write protect pin mode register which stores a parameter value corresponding to an operation mode of the write protect pin.

20. The memory system according to claim 15, wherein the controller comprises a write protect pin mode information storage unit which stores information about an operation mode of the write protect pin.

* * * * *